(12) United States Patent
Nowak et al.

(10) Patent No.: US 6,868,856 B2
(45) Date of Patent: Mar. 22, 2005

(54) ENHANCED REMOTE PLASMA CLEANING

(75) Inventors: Thomas Nowak, Cupertino, CA (US);
Ian Latchford, Sunnyvale, CA (US);
Tsutomu Tanaka, Santa Clara, CA
(US); Bok Heon Kim, San Jose, CA
(US); Ping Xu, Fremont, CA (US);
Jason Foster, Santa Clara, CA (US);
Heath B. DeShong, Livermore, CA
(US); Martin Seamons, San Jose, CA
(US)

(73) Assignee: Applied Materials, Inc., Santa Clara, CA (US)

( * ) Notice: Subject to any disclaimer, the term of this patent is extended or adjusted under 35 U.S.C. 154(b) by 482 days.

(21) Appl. No.: 09/905,515

(22) Filed: Jul. 13, 2001

(65) Prior Publication Data

US 2003/0010355 A1 Jan. 16, 2003

(51) Int. Cl.[7] .................... B08B 6/00; H01L 21/306
(52) U.S. Cl. ............... 134/1.1; 134/1; 134/1.2; 134/1.3; 134/56 R; 134/902; 216/67; 156/345.24; 156/345.35; 204/192.32; 204/192.35; 204/192.36
(58) Field of Search ............... 134/1, 1.1, 1.2, 134/1.3, 56 R, 902; 216/67; 156/345.24, 345.26, 345.29, 345.35, 345.36; 204/192.32, 192.35, 192.36

(56) References Cited

U.S. PATENT DOCUMENTS

| 4,138,306 A | 2/1979 | Niwa |
| 4,563,367 A | 1/1986 | Sherman |
| 4,910,042 A | 3/1990 | Hokynar |
| 4,913,929 A | 4/1990 | Moslehi et al. |
| 4,988,644 A | 1/1991 | Jucha et al. |
| 5,000,113 A | 3/1991 | Wang et al. |
| 5,158,644 A | 10/1992 | Cheung et al. |
| 5,346,579 A | 9/1994 | Cook et al. |
| 5,350,480 A | 9/1994 | Gray |
| 5,403,434 A | 4/1995 | Moslehi |
| 5,662,770 A | 9/1997 | Donohoe |
| 5,688,357 A | 11/1997 | Hanawa |
| 5,770,098 A | 6/1998 | Araki et al. |
| 5,788,778 A * | 8/1998 | Shang et al. .................. 134/1 |
| 5,792,272 A | 8/1998 | van Os et al. |
| 5,812,403 A | 9/1998 | Fong et al. ............ 364/468.28 |

(List continued on next page.)

FOREIGN PATENT DOCUMENTS

| DE | 4132559 | | 4/1993 |
| EP | 0537950 | | 4/1993 |
| EP | 0552491 | | 7/1993 |
| EP | 697467 | * | 2/1996 |
| JP | 1-220434 | | 9/1989 |
| JP | 2-125876 | | 5/1990 |
| WO | WO 97/03223 | | 1/1997 |
| WO | WO9902754 | * | 1/1999 |
| WO | WO 99/03312 | | 1/1999 |

OTHER PUBLICATIONS

Grill, Alfred, "Cold Plasma in Materials Fabrication", IEEE Press, 1994, pp. 109–110, 160–163.

Primary Examiner—Rodney G. McDonald
(74) Attorney, Agent, or Firm—Townsend and Townsend and Crew

(57) ABSTRACT

Methods and apparatus for cleaning semiconductor processing equipment. The apparatus include both local and remote gas dissociators coupled to a semiconductor processing chamber to be cleaned. The methods include introducing a precursor gas into the remote dissociator where the gas is dissociated and introducing a portion of the dissociated gas into the chamber. Another portion of the dissociated gas which re-associates before introduction into the chamber is also introduced into the chamber where it is again dissociated. The dissociated gas combines with contaminants in the chamber and is exhausted from the chamber along with the contaminants.

18 Claims, 5 Drawing Sheets

U.S. PATENT DOCUMENTS

| | | |
|---|---|---|
| 5,844,195 A | 12/1998 | Fairbairn et al. |
| 5,939,831 A | 8/1999 | Fong et al. ............. 315/111.21 |
| 5,942,804 A | 8/1999 | Mohwinkel et al. |
| 6,039,834 A | 3/2000 | Tanaka et al. |
| 6,060,400 A | 5/2000 | Oehrlein et al. |
| 6,109,206 A | 8/2000 | Maydan et al. |
| 6,125,859 A | 10/2000 | Kao et al. |
| 6,148,832 A | 11/2000 | Gilmer et al. |
| 6,170,428 B1 | 1/2001 | Redeker et al. |
| 6,182,602 B1 | 2/2001 | Redeker et al. |
| 6,217,951 B1 | 4/2001 | Mizuno et al. |
| 6,329,297 B1 | 12/2001 | Balish et al. |
| 6,387,207 B1 | 5/2002 | Janakiraman et al. |

\* cited by examiner

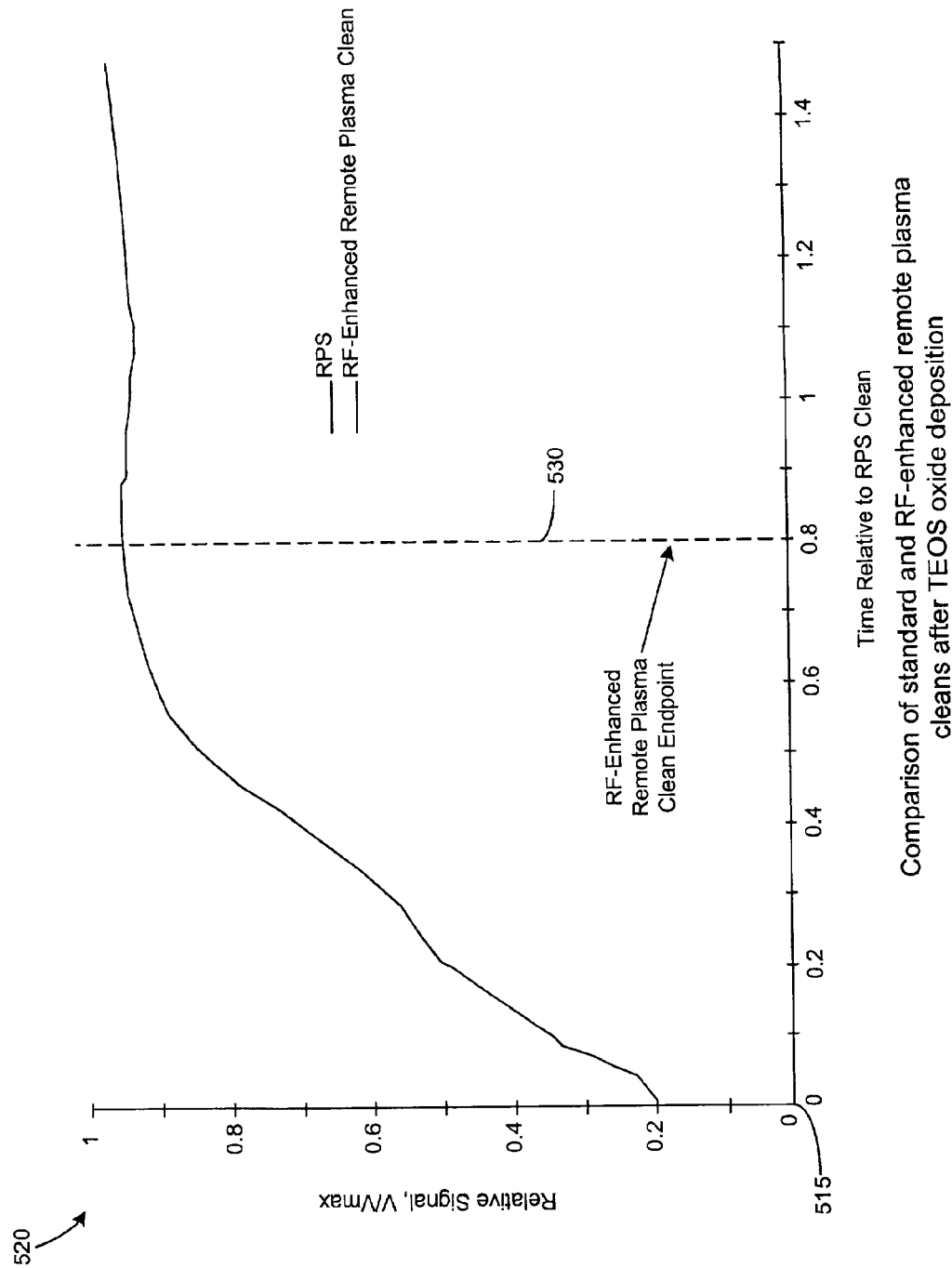

ENHANCED REMOTE PLASMA CLEANING

BACKGROUND OF THE INVENTION

The present invention relates in general to methods and apparatus for cleaning semiconductor processing equipment, and in particular to remote equipment cleaning where the equipment is cleaned without exposure to the surrounding atmosphere.

In general, manufacturing semiconductor devices involves many processing steps performed under extremely clean conditions using semiconductor processing equipment. At any of the processing steps, the manufactured device may be exposed to a seemingly small amount of contamination which may result in a defect to the device. For example, a contaminant particle as small as 100 Å in diameter can result in a fatal defect in a manufactured device. Thus, reducing contamination during semiconductor processing is directly related to device yield and, in turn, profits.

The problem of contamination is exacerbated by the continual reduction in feature size and also by increasing wafer and die sizes. More specifically, decreasing feature size results in potential defects from ever smaller contaminants. Further, increasing wafer and die sizes subjects a high cost, larger die device to failure due to a single contaminant particle. Alternatively, a large number of smaller die devices on a larger wafer are subject to contamination by a single contaminant particle. Thus, as feature size continues to shrink and wafer and die sizes continue to increase, contamination controls must be advanced to allow economically viable semiconductor device manufacture.

One important source of contaminants is the processing equipment itself. Over time, contaminants form on the processing equipment in the form of both particulates and films. It is possible for the contaminants to migrate to the device resulting in short circuits, open circuits, or other manufacturing defects. In turn, these defects reduce manufacturing yields which increase processing costs and reduce profits. To avoid migration of contaminants formed on the processing equipment to a device, processing equipment must be cleaned periodically. The effectiveness and frequency of cleaning directly impacts processing costs and device yields. As cleaning semiconductor processing equipment directly impacts processing costs and device yields, it is desirable to develop new and advanced cleaning methods.

At present, various methods are used to clean semiconductor processing equipment. In general, the equipment can be cleaned either by opening a processing chamber and manually wiping the chamber (wet clean), or remotely by introduction of cleaning elements to a sealed chamber (dry clean). While manually wiping the chamber is effective, it is time consuming and interferes with normal substrate processing.

Alternatively, the equipment can be cleaned remotely. At present, remote equipment cleaning is accomplished using a remote plasma method. Both methods utilize a cleaning precursor that is often a perflouro-compound (PFC) such as $NF_3$ or $C_xF_y$. The PFC is dissociated in a plasma to generate highly reactive radicals, such as atomic fluorine (F).

Remote plasma cleaning is a gentle cleaning technique where a remote energy source is used to create a plasma and reactive radicals outside of the processing chamber. Radicals, such as F, then enter the processing equipment and remove contaminants formed on the processing equipment. More specifically, the radicals react with contaminants formed on the equipment walls to form reactant gases that are suitably discharged from the equipment by an exhaust system. While remote plasma cleaning is an effective method, it exhibits a number of drawbacks.

First, as the fluorine radicals are formed in plasma outside the processing equipment and subsequently introduced into the equipment, they are subject to recombination before they react with contaminants in the processing equipment. More specifically, reactive F radicals recombine to form less reactive $F_2$. These less reactive $F_2$ molecules are not capable of cleaning the processing equipment. In a typical example, more than 90% of F radicals recombine without reacting in the cleaning process. This significant recombination loss occurs during transport from the remote plasma source to the equipment to be cleaned and results in low cleaning efficiency and increased cleaning costs.

In addition, remote plasma cleaning does not involve physical sputtering of residue nor heating of the equipment. Without heating and sputtering, remote plasma cleaning proceeds at a slower rate. The slower clean rate reduces cleaning efficiency and increases process costs.

Further, it is difficult to pinpoint the time at which the cleaning has been completed, i.e., when the last contaminant on the equipment has reacted with a cleaning radical so that it can be discharged from the equipment. The difficulty in detection is due to the reliance of typical detection systems on testing of plasma within the equipment. This difficulty in determining the completion of the cleaning results in both inefficiency and potential errors.

In contrast, in-situ RF plasma cleaning involves application of an RF energy source to create plasma within the processing equipment. More specifically, a precursor gas is pumped into the process chamber and subjected to the RF energy source. The RF energy produces a plasma within the precursor gas. Typically, the precursor gas includes some form of fluorine and the reaction creates F radicals. Similar to remote plasma cleaning, the radicals interact with contaminants formed on the equipment walls to form reactant gases that are suitably discharged from the equipment by an exhaust system. Since, the in-situ plasma clean generates the desired cleaning chemistry inside the process chamber, this approach does not suffer from recombination losses due to radical transport from the remote plasma source to the process chamber.

Unfortunately, while the increased concentration of radicals results in higher cleaning efficiencies and effectiveness, the direct exposure to the plasma also damages processing equipment. This damage results in increased equipment wear from exposing processing equipment to plasmas created from highly reactive gases, leading to equipment failure or downtime.

In addition, as much as 90% of the precursor gas remains unreacted during typical in-situ plasma formation. More specifically, dissociation efficiency can be as low as 10% for $CF_4$ used in in-situ RF plasma cleans. As the precursor gases are typically PFCs, the low dissociation efficiency of precursor gas results in significant levels of PFCs emitted from the cleaning process. It is highly desirable to avoid emission of PFCs as they are a contributor to global warming.

Thus, it can be seen from the discussion above that the art would be improved by advanced methods and apparatus for cleaning semiconductor processing equipment to increase cleaning rate and efficiency while reducing PFCs and wear on the equipment.

SUMMARY OF THE INVENTION

An embodiment of the present invention comprises a cleaning system adapted for cleaning a semiconductor processing equipment. The cleaning system is operable to dissociate a gas in a remote dissociator and transfer the dissociated gas to an equipment to be cleaned. A portion of the dissociated gas which re-associates before introduction into the equipment is dissociated in the equipment. The dissociated gas is operable to clean the equipment.

Other embodiments include methods for cleaning a semiconductor processing equipment. The methods comprise introduction of a precursor to a dissociator, dissociating the precursor to create radicals, and introducing a portion of the radicals to the equipment to be cleaned. The methods further comprise introducing another portion radicals which re-associate into the equipment where they are dissociated. The radicals are operable to clean the equipment.

Some embodiments include a controller for controlling the cleaning system. The controller is coupled to a memory which includes a computer-readable program for directing control of the system. Some embodiments include an optical endpoint detector which indicates cleaning completion.

These and other embodiments of the present invention are described in more detail in conjunction with the text below and attached figures.

BRIEF DESCRIPTION OF THE DRAWINGS

FIG. 5 is a diagram plotting cleaning process completion time.

DESCRIPTION OF THE SPECIFIC EMBODIMENTS

The present invention provides systems and methods for cleaning contaminants from equipment. An embodiment of the present invention is particularly suited for cleaning equipment including, but not limited to, parallel plate reactors. However, it should be recognized that the present invention is applicable to cleaning a wide variety of equipment.

Figure 1:
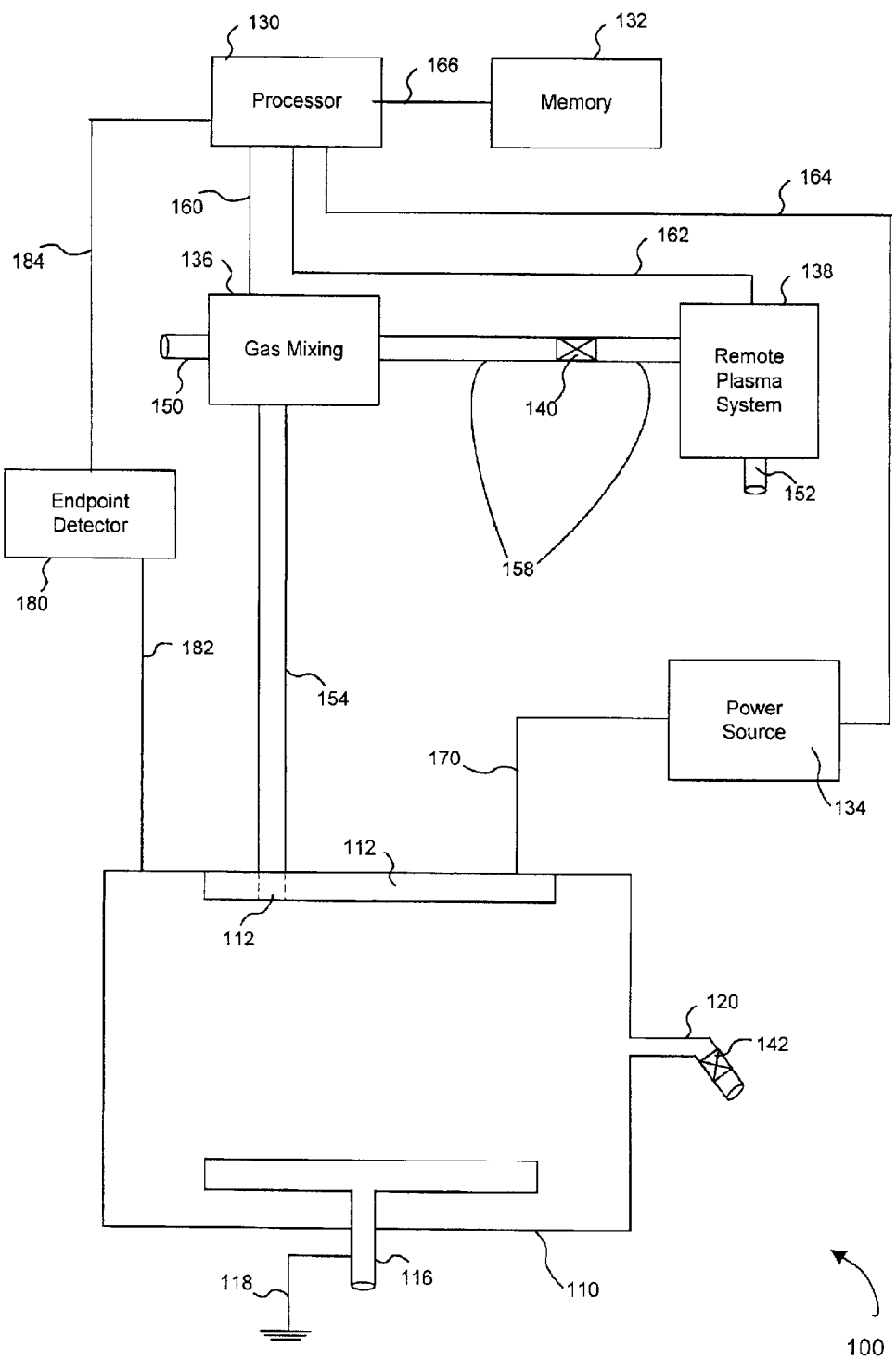
FIG. 1 is a simplified schematic of an equipment cleaning system according to the present invention.

Elements of the present invention are described in relation to a diagram of a cleaning system 100 as illustrated in FIG. 1. Referring to FIG. 1, some embodiments of cleaning system 100 include an equipment to be cleaned 110, which in an embodiment is a process chamber used to process semiconductor substrates. Additionally, an embodiment of system 100 includes a processor 130, a processor memory 132, a local plasma system (described below), a gas mixing block 136, a remote plasma system 138, and an endpoint detector 180. Equipment to be cleaned 110 includes, but is not limited to, a faceplate 112, a faceplate orifice 114, a bottom faceplate 116, and a bottom face plate ground 118. The local plasma system includes, but is not limited to, a power source 134, faceplate 112, bottom faceplate 116, bottom face plate ground 118, and an interconnect 170.

Operation of system 100 is facilitated by various interconnects and valves. The valves include a remote valve 140 and an exhaust valve 142. The conduits include a gas inlet conduit 150, a remote inlet conduit 152, transport conduits 154 and 158, and an exhaust conduit 120. Processor 130 is connected to gas mixing block 136 by an interconnect 160, to remote plasma system 138 by an interconnect 162, to power source 134 by an interconnect 164, and to processor memory 132 by an interconnect 166. Power source 134 is connected to faceplate 112 of equipment 110 by interconnect 170.

Remote plasma system 138 is preferably a remote microwave plasma system. However, it should be recognized by one skilled in the art that any system capable of dissociating elements to form cleaning radicals remote from equipment 110 can be used in accordance with the present invention.

In an embodiment, remote plasma system 138 accepts a precursor gas via remote inlet conduit 152 and forms a plasma in the precursor gas which causes disassociation of the precursor gas to form cleaning radicals. Preferably, the cleaning radicals are F atoms or $F^+$ ions derived from a precursor gas such as $NF_3$ or $C_xF_y$. Alternatively, the precursor gas can be any liquid, gas or solid which can be reacted to form cleaning radicals. The cleaning radicals are not limited to forms of fluorine, but rather can be any element, such as chlorine, that is capable of reacting with contaminants on equipment surfaces. Remote plasma system 138 provides high efficiency dissociation of the precursor gas. In an embodiment, a dissociation for $NF_3$ of greater than 90% is achieved. In alternative embodiments, a dissociation of greater than 40%, greater than 60% or greater than 80% is achieved. In general, a high dissociation efficiency can be a dissociation of greater than 90%. This high dissociation efficiency results in reduced PFCs emitted as exhaust gasses along with reduced quantities of precursor gas.

Figure 2:
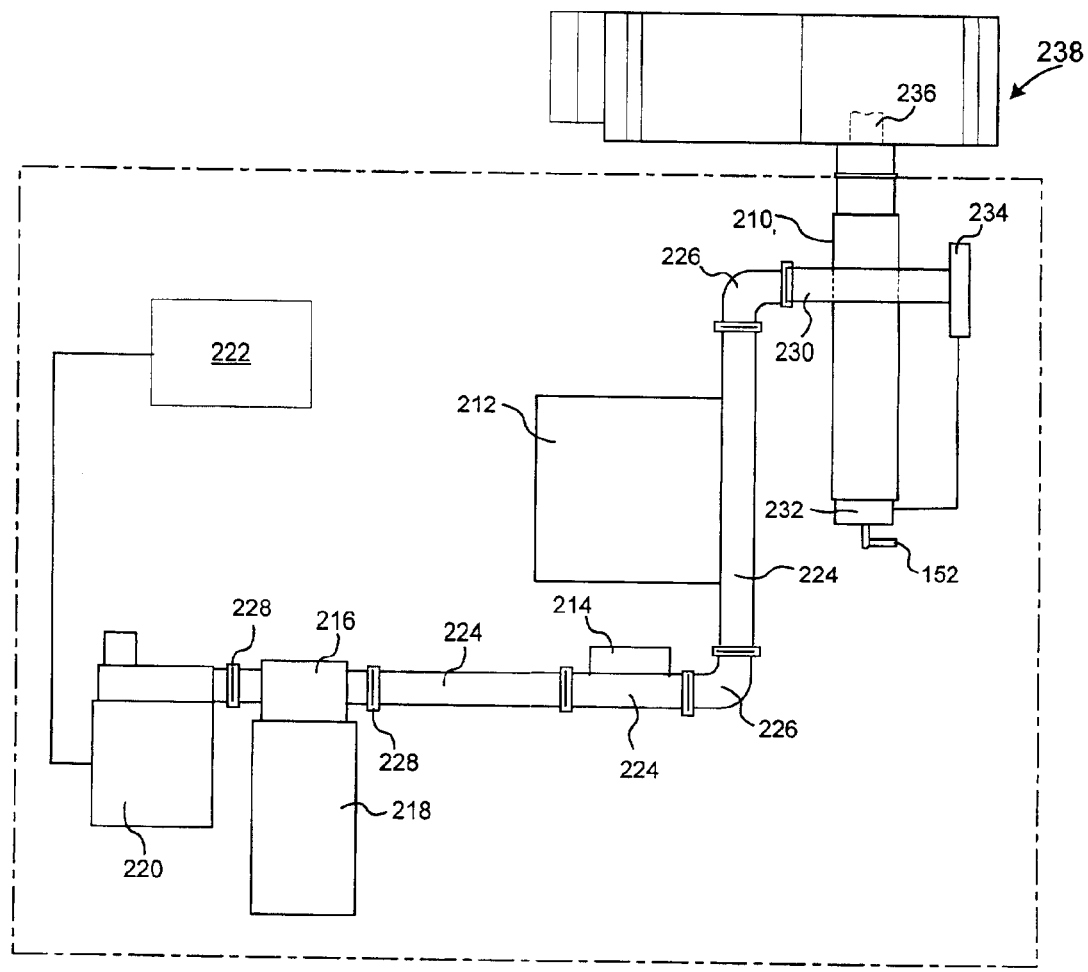
FIG. 2 is a diagram of a remote plasma system.

Referring to FIG. 2, an embodiment of remote plasma system 138 is described. It should be noted that the discussion of remote plasma system 138 is adapted from disclosure provided in U.S. Pat. No. 5,939,831 entitled Methods and Apparatus for Pre-Stabilized Plasma Generation for Microwave Clean Applications, and U.S. Pat. No. 5,812,403 entitled Methods and Apparatus for Cleaning Surfaces in a Substrate Processing System both assigned to the assignee of the present invention and both incorporated herein by reference. Remote plasma system 138 is preferably adapted for performing periodic cleaning of undesired contaminants from surfaces of equipment 110. Remote plasma system 138 receives precursor gases via input line 152 which are energized by microwave radiation to create plasma comprising cleaning radicals. The cleaning radicals are then sent via transport conduits 158 and 154 for dispersion through face plate orifice 114 and into equipment 110.

Remote plasma system 138 includes an applicator tube 210, a plasma ignition system (described below), a microwave guide system (described below), optimizing elements including an impedance matching system 212, which may include an optional phase detector 214 for embodiments requiring feedback for automatic impedance matching. A circulator 216 with a load 218, and a magnetron 220 are also included with remote plasma system 138.

Magnetron 220 is a typical magnetron source capable of operating between 500 and 2500 watts for continuous wave (CW) or pulsed output of microwaves of about 2.45 gigahertz (GHZ) frequency. Magnetron 220 is powered by power supply 222 which may be remotely located from magnetron 220. Of course, other magnetrons may be utilized as well. Microwaves from magnetron 220 are transmitted to the microwave wave guide system which includes various lengths of straight and curved wave guide sections 224 and 226 which can be connected together at joints 228. Interspersed within the wave guide system are optimizing elements that work to provide low loss, maximum microwave transmission with minimized reflection losses and to protect magnetron 220 from damage due to reflective power. The description below follows the desired direction of microwaves from magnetron 220 toward applicator tube 210.

In an embodiment, magnetron 220 is connected to a circulator 216. Circulator 216 allows only forward microwave transmission from magnetron 220 toward applicator tube 210. Load 218 absorbs any power that might be reflected back from the wave guide system towards magnetron 220. Circulator 216 and load 218 thereby direct microwaves in the forward direction and protect magnetron 220 from damage from reflective power. Circulator 216 connects to wave guide section 224 that is connected to phase detector 214 which is connected to another wave guide section 224. Phase detector 214, if utilized, is coupled via curved wave guide section 226 to another wave guide section 224 having attached impedance matching system 212. Impedance matching system 212, which may use stub tuners or other tuning elements, provides remote plasma system 138 with the ability to match a load at wave guide section 230 to 50 Ohms, the characteristic impedance of the wave guides. Impedance matching system 212 may provide fixed tuning, manual tuning or automated tuning according to specific embodiments. For embodiments using automated tuning, phase detector 214 is a 3-diode array which detects the phase of microwaves transmitted for feedback to impedance matching system 212, which intelligently and dynamically matches the load appropriately. In an embodiment, wave guide sections 224 and 226 have rectangular cross sections but other types of wave guides may also be used.

As illustrated in FIG. 2, microwaves directed through the wave guide system are transmitted from output wave guide section 230 to applicator tube 210 where a plasma is created. Applicator tube 210 has an input feed line 152 that receives precursor gases that are energized from microwaves emitted from magnetron 220 via the wave guide system and other optimizing elements. Applicator tube 210 is preferably a circular tube made of a composite or ceramic material, such as alumina, or other material resistant to etching by radicals in the plasma. In an embodiment, applicator tube 210 has a length of about 18–24 inches and a cross section diameter of about 3–4 inches. Applicator tube 210 is disposed through wave guide section 230, which is open at one end for transmitting microwaves and is terminated at the other end. Microwaves are thus able to pass through the open end of wave guide section 230 to precursor gases inside applicator tube 210 which is transparent to microwaves. Of course, other materials such as sapphire may also be used for the interior of applicator tube 210. In other embodiments, applicator tube 210 may have a metal exterior and an interior made of composite or ceramic material.

In an embodiment, a plasma can be ignited by a plasma ignition system which includes an ultraviolet (UV) lamp 232 and a UV power supply 234, which can optionally be mounted on the wall of wave guide section 230. Of course, UV power supply 234 may be mounted in various other locations besides the wall of wave guide 230. Powered by UV power supply 234, UV lamp 232 provides the initial ionization of the plasma within applicator tube 210. Microwave energy then sustains the ionization of the ignited plasma to create cleaning radicals that enter inlet 236 leading to equipment 110 via valve 140. Due to changes in load within applicator tube 210 from the introduction and ionization of precursor gases within applicator tube 210, use of matching system 212 optimizes the microwave energy coupling efficiency. In some embodiments impedance matching system 212 includes at least one stub tuner under the control of processor 130. As mentioned above, other conventional tuning elements may also be used in impedance matching system 212.

Created cleaning radicals are input through inlet 236 into the passage and enclosure assembly 238 which is equipped with a liner 240 preferably made of polytetraflouroethylene (PTFE). PTFE, which is commercially available for example as Teflon™ (TPFE), is resistant to etching or deposition from the radicals input at inlet 236. Further, liner 240 inhibits fluorine radical recombination in the passage during cleaning processes. Liner 240 also may be made of fluorinated material including fluorinated polymer such as PFA (which is a polymer combining the carbon-fluorine backbone of polytetrafluourоethylene resins with a perfluoro-alkoxy side chain), fluorinated ethylene-propylene (TFE), or the like. The passage is preferably circular in cross-section or other type of cross-section to match the cross-section of inlet 236 and applicator tube 210. From enclosure assembly 238, cleaning radicals flow into conduit 158 to equipment 110 via remote valve 140.

Referring again to FIG. 1, processor 130 combined with processor memory 132 provide control for system 100. Processor 130 control includes controlling operation of the local plasma system including power source 134, remote plasma system 138, gas mixing block 136, endpoint detector 180, and valves 140 and 142. Acting as controller, processor 130 executes control software, which is a computer program stored in the processor memory 132. Preferably, processor memory 132 may be a hard disk drive or random access memory, but of course processor memory 132 can be other kinds of memory. Processor 130 executes control software, which includes sets of instructions that dictate the timing, mixture of gases, equipment pressure, equipment temperature, power levels, and other parameters of a particular process. Preferably, control software is written in any computer readable programming language such as, for example, 68000 assembly language, C, C++, Pascal, Fortran, or other language.

Gas mixing block 136 is preferably a dual input mixing block coupled to gas inlet conduit 150 and transport conduit 158. Gas inlet conduit 150 typically carries process gasses to system 100 while transport conduit 158 typically carries cleaning radicals from remote plasma system 138. Alternatively, gas mixing block 136 can be any system capable of mixing gases introduced from one or more sources.

In some embodiments, remote valve 140 isolates the cleaning process from other processes performed with equipment 110. Remote valve 140 normally remains closed while equipment 110 is not being cleaned. In the closed position, remote valve 140 prevents elements in conduit 158 from being introduced to equipment 110 during manufacture of a device. Further, remote valve 140 reduces the dead volume of conduit 158 during use of equipment 110. Remote valve 140 is preferably made of PTFE to minimize damage or deposition onto the closed remote valve 140 during use of equipment 110. In an exemplary embodiment, remote valve 140 is a particle grade gate valve. In some embodiments using remote valve 140, only when equipment 110 is used for a device cleaning step or when equipment cleaning is performed, does remote valve 140 open to allow cleaning radicals to flow into gas mixing block 136, as illustrated in FIG. 1. As implied above, in some embodiments, remote valve 140 is not used at all. Any cleaning radicals in remote system 138 may then flow through passages and into equipment 110.

Endpoint detector 180 can be any system capable of determining the completion of a cleaning process performed on equipment 110. Endpoint detector 180 can be further capable of indicating completion of the cleaning process to processor 130. In an embodiment, endpoint detector 180 is a low-cost, optical emission endpoint detector which can determine the endpoint of a cleaning process by detecting changes in light intensity that occur due to absorbance of light by plasma in equipment 110. Use of a low cost endpoint detector is advantageously facilitated by the existence of plasma in equipment 110 resulting from the present invention. In an alternative embodiment, a higher cost endpoint detector 180 coupled to exhaust conduit 120 of equipment 110 can be used to detect changes in light intensity due to absorbance of light by exhausted gas reactants such as $SiF_x$. While two types of endpoint detectors have been described, it should be recognized that other methods and/or apparatus for determining completion of a cleaning process can be used in accordance with the present invention.

As the cleaning reactions proceed, fewer and fewer contaminants remain on equipment 110. After substantially all contaminants have been removed, endpoint detector 180 signals cleaning completion and remote valve 140 is closed to prevent additional cleaning radicals from entering equipment 110. It is valuable to properly determine cleaning process completion as continued introduction of cleaning radicals increases wear on equipment 110.

The local plasma system can be any system capable of dissociating elements to form cleaning radicals in equipment 110. The local plasma system includes power source 134 which can be any power source capable of producing sufficient energy to dissociate a gas resulting in the creation of cleaning radicals. In some embodiments, the RF power source is a 13.56 MHz, 300–400 kV source. In an embodiment, the local plasma system operates by initiating power source 134 to apply power to face plate 112 via interconnect 170. The power applied is referenced to bottom face plate ground 118. By application of power to face plate 112, a voltage differential is produced in equipment 110 which creates a plasma within a gas contained in equipment 110. Creation of the plasma results in the creation of cleaning radicals in equipment 110. In-situ RF plasma cleaning is a combination of pure chemical and ion-assited cleaning. The cleaning radicals created in equipment 110 react with contaminants on equipment 110 to form exhaust gases. The reaction acts to clean equipment 110.

Of special interest, the local plasma system can dissociate radicals created by remote plasma system 138 which recombined to form less reactive elements during transit from remote plasma system 138 to equipment 110. Advantageously, this secondary dissociation maximizes concentration of cleaning radicals within equipment 110 without further increasing PFC exhaust gases. Thus, the local plasma system can effectively reverse at least some of the transport related recombination of cleaning radicals.

In addition, creation of plasma in equipment 110 by the local plasma system causes a temperature increase in equipment 110. As chemical etching reaction rates typically display an exponential dependence on temperature, the increased temperature can boost reaction rates between cleaning radicals and contaminants on equipment 110. This increased reaction rate advantageously results in an increased cleaning rate.

The cleaning rate is further increased due to creation of ions through use of the local plasma system. For example, some cleaning radicals which recombine during transport are dissociated into reactive ions such as $F^+$. These ions impact equipment 110 surfaces with significant energy resulting in an increase in the cleaning rate. By tightly controlling the local plasma system, undue wear to equipment 110 due to ion bombardment is limited.

Figure 3:
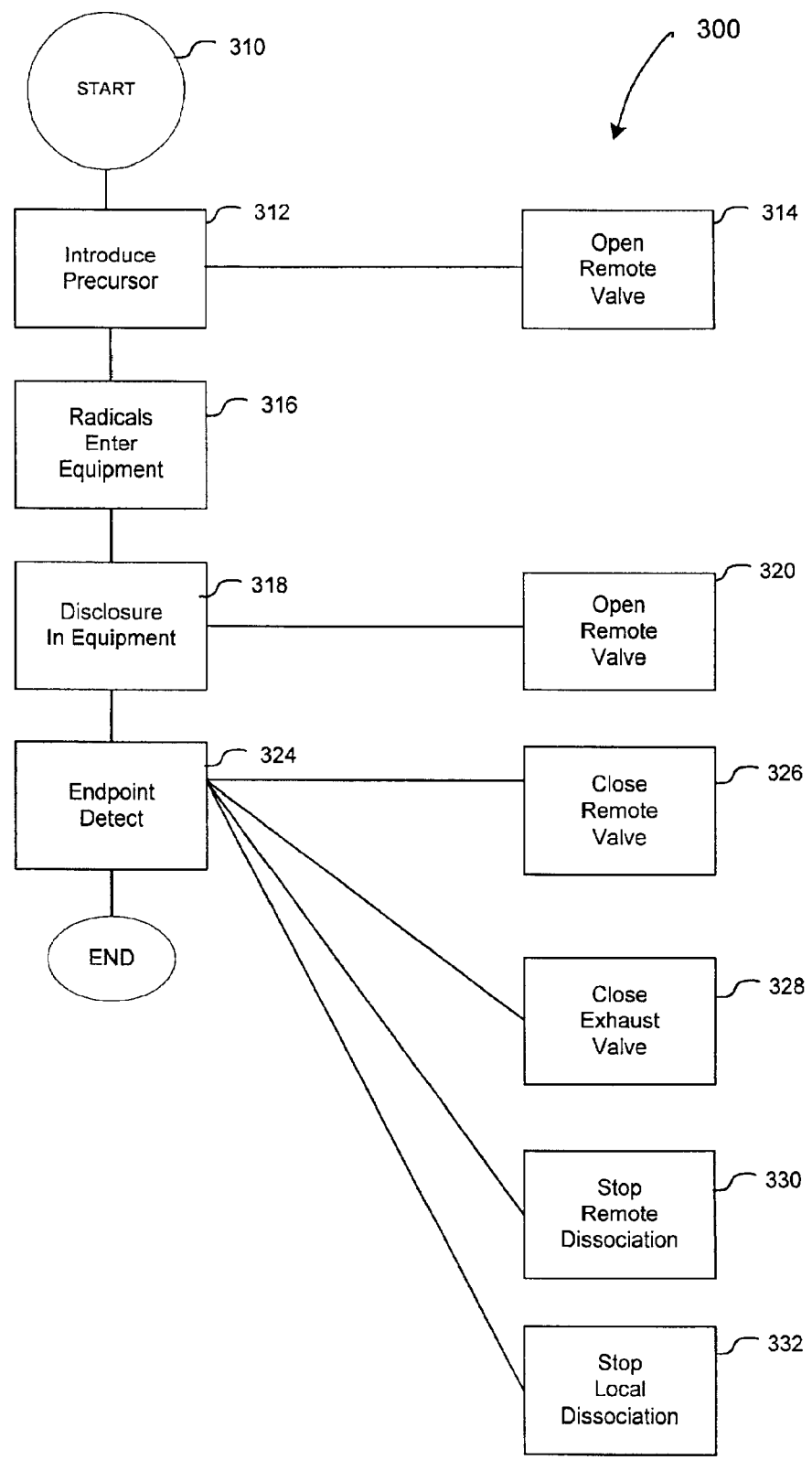
FIG. 3 is a flow diagram showing a simultaneous combination of activity in the remote and local plasma systems according to the present invention.

Thus, some embodiments of the present invention damage to chamber hardware is reduced by decreasing ion bombardment. This can be done by keeping in-situ RF power as low as possible without degrading cleaning ability. Another approach involves reducing gas mass by, for example, using lower mass gasses such as Helium. Further detail about the cleaning process is provided with reference to FIG. 3 and FIG. 4. FIG. 3 is a flow diagram showing a combination of activity in remote plasma system 138 simultaneous with activity in the local plasma system to effectuate a clean of equipment 110. A simultaneous process 300 starts 310 by introduction 312 of a precursor gas into remote plasma system 138 via inlet conduit 152. At roughly the same time as introduction 312, an open remote valve step 314 is performed. Opening remote valve 140 allows elements to flow from remote plasma system 138 to equipment 110.

With the precursor gas in remote plasma system 138, dissociation of the precursor gas 316 is performed. Dissociation of the precursor gas 316 creates cleaning radicals which enter equipment 110 in step 318. The cleaning radicals enter equipment 110 via conduits 158 and 154 while passing through gas mixing block 136, remote valve 140, and plate orifice 114. On route, many of the cleaning radicals combine with other radicals to form less reactive elements. For example, radical F can recombine to form less reactive element $F_2$. Ultimately, cleaning radicals which enter equipment 110 in step 318 without recombining, clean equipment 110 by reacting with contaminants on surfaces of equipment 110 to form exhaust gases, such as $SiF_x$.

Roughly coincident with step 318, an open exhaust valve 142 step 320 is performed. Opening exhaust valve 142 allows exhaust gases formed during the reaction between radicals and contaminants to be exhausted from equipment 110.

To increase cleaning effectiveness, the less reactive elements discussed in association with step 316 are dissociated 322 in equipment 110 by the local plasma system to re-create radicals. Both the radicals created in step 316 and the radicals created in step 322 react with contaminants remaining on equipment 110. When reactions between contaminants and radicals adequately diminish, endpoint detector 180 signals process end 324. In an embodiment, endpoint detector 180 signals process end 324 when an output voltage signal is greater than 95% of a maximum output voltage signal. In some embodiments, an endpoint is determined by measuring rate of change of ongoing reactions, where the exact endpoint is determined based on the specific film. Exact endpoint criteria depend on film. At process end 324, both remote valve 140 and exhaust valve 142 are closed in respective steps 326 and 328. Further, dissociation in the remote plasma system 138 and the local plasma system dissociation are stopped in respective steps 330 and 332.

An exemplary embodiment involves application of the present invention to hard-to-clean residues such as Amorphous carbon films such as, but not limited to, Applied Materials $BLO_K$™. Removing $BLO_K$ residues is not possible using an existing remote clean method. $BLO_K$ residue can be cleaned using existing in-situ $CF_4$ RF plasma. However, use of the in-situ clean results in the undesirable effects described in relation to in-situ RF plasma cleaning. Further, after only a hundred 500 Å-deposition/clean cycles, the process is seen to drift and a polymer residue is observed on the equipment.

Using the present invention, the $BLO_K$ residue can be effectively removed. Referring again to FIG. 3, an $NF_3$ precursor gas is introduced into remote plasma system 138. In step 316, the $NF_3$ is dissociated to form fluorine radicals (F) and nitrogen ($N_2$). In step 318, the basic reaction is:

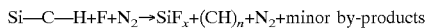
$$Si\text{—}C\text{—}H+F+N_2 \rightarrow SiF_x+(CH)_n+N_2+\text{minor by-products}$$

where the fluorine radicals generated within remote plasma system 138 combine with the silicon in the $BLO_K$ film to form $SiF_x$ (e.g., predominantly $SiF_4$ gas) and leave behind a polymer film of the form $(CH)_n$. Further, the number of fluorine radicals is increased by activating the local plasma system in step 322 which also act to heat equipment 110 and stimulate ion bombardment.

Additionally, oxygen ($O_2$) is injected into equipment 110 via inlet conduit 150. The oxygen acts to remove the remaining film $(CH)_n$ by combining with the carbon in the film to form volatile $CO_y$ by-products. The resulting reaction is:

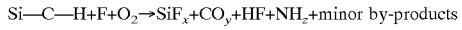
$$Si\text{—}C\text{—}H+F+O_2 \rightarrow SiF_x+CO_y+HF+NH_z+\text{minor by-products}$$

Thus, the present invention effectively cleans a hard to clean substance which previously could only be cleaned by existing in-situ RF plasma with all the negative effects associated with this type of cleaning. For example, remote plasma generation results in higher dissociation and lower PFC output than in-situ RF plasma. Additionally, the present invention is more gentle leading to reduced damage to the cleaned equipment. Such reduction in damage is at least partially attributable to reduced ion bombardment resulting from lower power levels.

Figure 4:
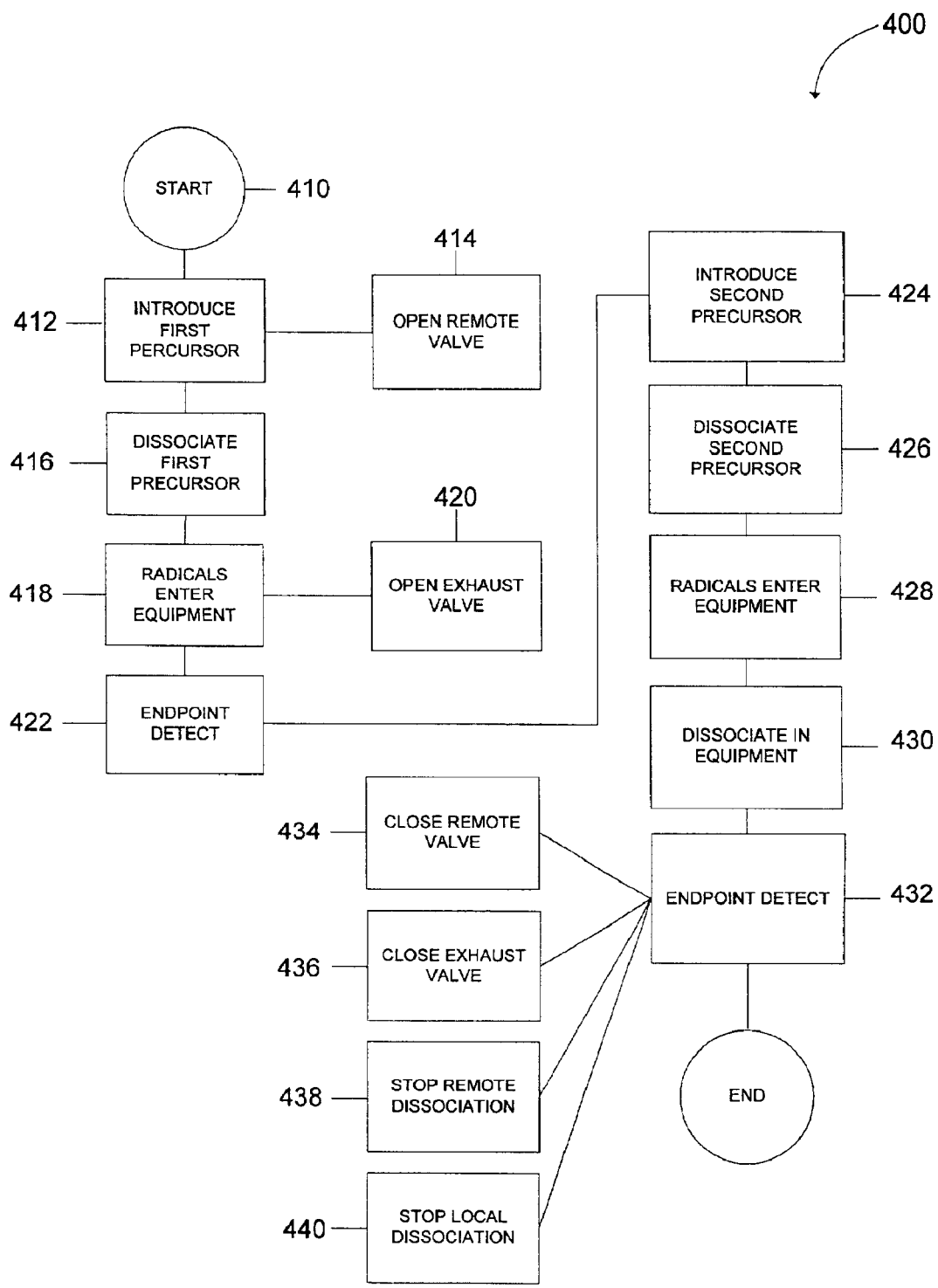
FIG. 4 is a flow diagram showing a combination of sequential and simultaneous activity in the remote and local plasma systems.

Turning now to FIG. 4, FIG. 4 is a flow diagram showing a combination of activity in remote plasma system 138 sequentially followed by activity in the local plasma system to effectuate a clean of equipment 110. A sequential process 400 starts 410 by introduction 412 of a first precursor gas into remote plasma system 138 via inlet conduit 152. At roughly the same time as introduction 412, an open remote valve step 414 is performed. Opening remote valve 140 allows elements to flow from remote plasma system 138 to equipment 110.

With the first precursor gas in remote plasma system 138, dissociation of the first precursor gas 416 is performed. Dissociation of the first precursor gas 416 creates cleaning radicals which enter equipment 110 in step 418. The radicals enter equipment 110 via conduits 158 and 154 while passing through gas mixing block 136, remote valve 140, and plate orifice 114. On route, many of the radicals combine with other radicals to form less reactive elements. Ultimately, cleaning radicals which enter the equipment 110 in step 418 without recombining, react with contaminants on equipment 110 to form exhaust gases, such as $SiF_x$.

Roughly coincident with step 418, an open exhaust valve 142 step 420 is performed. Opening exhaust valve 142 allows gases formed during the reaction between radicals and contaminants to be exhausted from equipment 110. After the radical contaminant reactions sufficiently stop, endpoint detector 180 signals a process end 422.

After process end 422, a second precursor gas is introduced 424 into remote plasma system 138 via conduit 152. With the second precursor gas in remote plasma system 138, dissociation of the second precursor gas 426 is performed. Dissociation of the second precursor gas 426 creates cleaning radicals which enter equipment 110 in step 428. Similar to the discussion associated with step 418, a number of the radicals recombine during transport from remote plasma system 138 to equipment 110 to form less reactive elements. Again, for example, radical F can recombine to form less reactive element $F_2$. To increase cleaning effectiveness, the less reactive elements are dissociated 430 in equipment 110 by the local plasma system to re-create radicals. Both the radicals created in step 426 and the radicals created in step 430 react with contaminants remaining on equipment 110. As with the process described in relation to FIG. 3, when reactions between contaminants and radicals adequately diminish, endpoint detector 180 signals process end 432. Again, in an embodiment, endpoint detector 180 signals process end 432 when an output voltage signal is greater than 95% of a maximum output voltage signal. In some embodiments, an endpoint is determined by measuring rate of change of ongoing reactions, where the exact endpoint is determined based on the specific film. At the process end 432, both remote valve 140 and exhaust valve 142 are closed in respective steps 434 and 436. Further, dissociation in remote plasma system 138 and dissociation in the local plasma system are stopped in respective steps 438 and 440.

During the process, pressures in the chamber can be in the order of 0–50 Torr, and preferably from 0–10 Torr: In the remote plasma source, pressure can be less than 25 Torr, and preferably about 10 Torr.

An embodiment according to the flow diagram of FIG. 4 advantageously uses the local plasma system only when required, thus reducing energy consumption and damage to equipment 110.

Another benefit of the present invention is increased throughput relative to an existing remote plasma cleaning process. The benefit is illustrated by experimental data presented as FIG. 5. Specifically, FIG. 5 illustrates a comparison between the present invention and existing remote plasma cleaning. For control, both existing remote plasma cleaning and the present invention were performed individually after a similar TEOS oxide deposition in equipment 110. An X-axis 510 represents time measured from a start 515 to an endpoint 530 where the cleaning is complete. X-axis 510 is incrementally cross-hatched with numbers representing the time required for the present invention to fully perform the clean relative to the time required for the existing remote plasma process to perform the same clean. A Y-axis 520 represents progress of the cleaning process. Y-axis 520 is incrementally cross-hatched with numbers representing a voltage returned from endpoint detector 180 divided by a voltage indicative of cleaning completion (i.e. $V/V_{max}$). The progress of the clean as a function of time is shown as line 540. As illustrated in FIG. 5, the present invention performed the clean in only 80% of the time required by the existing remote plasma clean.

Thus, the present invention advantageously provides an effective, high-efficiency clean with low PFC emissions that result in decreased cost of ownership via decreased gas costs and increased throughput via increased clean rates. In addition, the present invention provides a better alternative for cleaning processes such as $BLO_K$ while significantly reducing PFCs and wear to processing equipment.

It is to be understood that the above description is intended to be illustrative and not restrictive. Many embodiments will be apparent to those of skill in the art upon reviewing the above description. By way of example, the invention herein has been illustrated primarily with regard to use of $NF_3$ and $C_xF_y$ precursor gases, but it is not so limited. It should be recognized that one skilled in the art would understand to apply different precursor gases according to the present invention to derive a desired result. Additionally, various aspects of the present invention may also be used for other applications. Those skilled in the art will recognize other equivalent or alternative uses for the present invention while remaining within the scope of the claims. The scope of the invention should, therefore, be determined not with reference to the above description, but should instead be determined with reference to the appended claims, along with the full scope of equivalents to which such claims are entitled.

What is claimed is:

1. A method of cleaning a semiconductor processing equipment, said method comprising:
   introducing a first precursor to a dissociator;
   dissociating said first precursor to create a first plurality of radicals;
   introducing a first portion of said first plurality of radicals to said equipment, a second portion of said first plurality of radicals re-associating to create less reactive elements;
   introducing said less reactive elements to said equipment;
   dissociating said less reactive elements to form a second plurality of radicals in said equipment;
   introducing a second precursor comprising oxygen into said equipment, wherein said second precursor bypasses said dissociator; and
   using the first and second portions of the first plurality of radicals and constituents of the second precursor to clean the equipment, wherein the oxygen combines with carbon on the equipment to form $CO_y$.

2. The method of claim 1, wherein said dissociating said first precursor provides at least 75% dissociation efficiency, whereby PFCs in an exhaust from said system equipment are reduced.

3. The method of claim 1, wherein said second portion of said first plurality of radicals is greater than said first portion of said first plurality of radicals.

4. The method of claim 3, wherein said first precursor comprises a fluorinated species capable of supplying atomic fluorine.

5. The method of claim 1, wherein said second plurality of radicals includes cleaning ions.

6. The method of claim 5, wherein said cleaning ions include at least one of F ions or Cl ions.

7. The method of claim 1, wherein said dissociating said less reactive elements creates physical sputtering.

8. The method of claim 1, wherein said less reactive elements include at least one of $F_2$ or $Cl_2$.

9. The method of claim 1, wherein said dissociating said first precursor includes forming a first plasma and said dissociating said less reactive elements includes forming a second plasma.

10. A semiconductor equipment cleaning system comprising:
    a housing;
    a remote dissociator configured to dissociate a first gas remote from said housing, said dissociation forming a second gas;
    a gas delivery system to introduce a portion of said first gas, a portion of said second gas, a third gas comprising oxygen, and a re-associated portion of said second gas into said housing, the third gas bypassing the dissociator;
    a local dissociator configured to dissociate said re-associated portion of said second gas;
    a controller for controlling said remote dissociator, said gas delivery system, and said local dissociator; and
    a memory coupled to said controller, said memory comprising a computer-readable medium having a computer-readable program embodied therein for directing operation of said semiconductor cleaning system, said computer-readable program comprising:
       instructions directing said remote dissociator to dissociate said first gas;
       an instruction to control said gas delivery system; and
       an instruction directing said local dissociator and said remote dissociator to dissociate a re-associated portion of said second gas.

11. A method for cleaning a deposition chamber, the method comprising:
    delivering a first precursor gas and a second precursor gas into a remote dissociator;
    dissociating at least part of the first precursor gas in the remote dissociator, wherein a first plurality of radicals are formed;
    dissociating at least part of the second precursor gas in the remote dissociator, wherein a second plurality of radicals are formed that are different from the first plurality of radicals;
    flowing a first portion of the first plurality of radicals into the deposition chamber, wherein the first portion of the first plurality of radicals react to clean the deposition chamber;
    flowing a second portion of the first plurality of radicals into the deposition chamber, wherein the second portion includes radicals associated to form less reactive elements;
    flowing a portion of the second plurality of radicals into the deposition chamber, wherein the portion of the second plurality of radicals react to clean the deposition chamber; and
    dissociating at least part of the less reactive elements in the deposition chamber, wherein the dissociated less reactive elements react to clean the deposition chamber;
    wherein the first precursor gas comprises fluorine, and the second precursor gas comprises chlorine.

12. A method for cleaning a deposition chamber, the method comprising:
    delivering a first precursor gas and a second precursor gas into a remote dissociator;
    dissociating at least part of the first precursor gas in the remote dissociator, wherein a first plurality of radicals are formed;
    dissociating at least part of the second precursor gas in the remote dissociator, wherein a second plurality of radicals are formed that are different from the first plurality of radicals;
    flowing a first portion of the first plurality of radicals into the deposition chamber, wherein the first portion of the first plurality of radicals react to clean the deposition chamber;
    flowing a second portion of the first plurality of radicals into the deposition chamber, wherein the second portion includes radicals associated to form less reactive elements;
    flowing a portion of the second plurality of radicals into the deposition chamber, wherein the portion of the second plurality of radicals react to clean the deposition chamber; and dissociating at least part of the less reactive elements in the deposition chamber, wherein the dissociated less reactive elements react to clean the deposition chamber;

wherein dissociating at least part of the less reactive elements in the deposition chamber is performed prior to flowing a portion of the second plurality of radicals into the deposition chamber, and wherein dissociating the second precursor gas is performed exclusively in the remote dissociator.

13. A method for cleaning a deposition chamber, the method comprising:

delivering a first precursor gas and a second precursor gas into a remote dissociator;

dissociating at least part of the first precursor gas in the remote dissociator, wherein a first plurality of radicals are formed;

dissociating at least part of the second precursor gas in the remote dissociator, wherein a second plurality of radicals are formed that are different from the first plurality of radicals;

flowing a first portion of the first plurality of radicals into the deposition chamber, wherein the first portion of the first plurality of radicals react to clean the deposition chamber;

flowing a second portion of the first plurality of radicals into the deposition chamber, wherein the second portion includes radicals associated to form less reactive elements;

flowing a portion of the second plurality of radicals into the deposition chamber, wherein the portion of the second plurality of radicals react to clean the deposition chamber; and dissociating at least part of the less reactive elements in the deposition chamber, wherein the dissociated less reactive elements react to clean the deposition chamber;

wherein dissociating at least part of the less reactive elements in the deposition chamber, is performed after flowing a portion of the second plurality of radicals into the deposition chamber.

14. A method for cleaning a deposition chamber contaminated with carbon and silicon based contaminants, the method comprising:

delivering $NF_3$ gas into a remote dissociator;

dissociating at least part of the $NF_3$ gas in the remote dissociator, wherein fluorine radicals are formed;

flowing a first portion of the fluorine radicals into the deposition chamber;

flowing a second portion of the fluorine radicals into the deposition chamber, wherein the second portion includes fluorine radicals associated to form less reactive elements;

dissociating at least part of the less reactive elements in the deposition chamber to form additional fluorine radicals, wherein the fluorine radicals react with the silicon based contaminants on the deposition chamber; and flowing oxygen into the deposition chamber, wherein the oxygen reacts with the carbon based elements in the chamber;

wherein the silicon and carbon based contaminants comprise a $BLO_K$ residue.

15. The method of claim 14, wherein the $BLO_K$ residue reacts with the fluorine radicals to form $SiF_x$, and with the oxygen to create $CO_y$.

16. The method of claim 14, wherein the oxygen is at least partially dissociated to create oxygen radicals.

17. The method of claim 14, wherein the carbon and silicon based contaminants are residue from deposition of an SiC material performed in the deposition chamber during a preceding deposition process.

18. A computer-readable storage medium having a computer-readable program embodied therein for directing operation of a semiconductor cleaning system, said semiconductor cleaning system comprising an equipment, a remote dissociator, a local dissociator, and a gas delivery system configured to introduce a gas from said remote dissociator into said equipment, said computer-readable program including instructions for operating said semiconductor cleaning system in accordance with the following:

delivering a first precursor gas comprising fluorine and a second precursor gas comprising chlorine into the remote dissociator;

dissociating at least part of the first precursor gas in the remote dissociator to form a first plurality of radicals;

dissociating at least part of the second precursor gas in the remote dissociator to form a second plurality of radicals different from the first plurality of radicals, the first and second plurality of radicals adapted for reacting with different chemical compounds on the equipment; and dissociating less reactive elements in the local dissociator, wherein the less reactive elements are formed from a portion of the first plurality of radicals that combine in the gas delivery system.

* * * * *